(12) United States Patent
Jang et al.

(10) Patent No.: US 12,457,723 B2
(45) Date of Patent: Oct. 28, 2025

(54) ELECTROMAGNETIC SHIELDING HOUSING AND ELECTROMAGNETIC SHIELDING CIRCUIT UNIT

(71) Applicants: HL MANDO CORPORATION, Pyeongtaek-si (KR); HL KLEMOVE CORP., Incheon (KR)

(72) Inventors: Youcheol Jang, Seoul (KR); Eundong Choi, Yongin-si (KR)

(73) Assignees: HL MANDO CORPORATION, Pyeongtaek-si (KR); HL KLEMOVE CORP., Incheon (KR)

( * ) Notice: Subject to any disclaimer, the term of this patent is extended or adjusted under 35 U.S.C. 154(b) by 337 days.

(21) Appl. No.: 18/123,427

(22) Filed: Mar. 20, 2023

(65) Prior Publication Data

US 2023/0320048 A1   Oct. 5, 2023

(30) Foreign Application Priority Data

Mar. 30, 2022   (KR) .................. 10-2022-0039975
Jan. 16, 2023   (KR) .................. 10-2023-0005941

(51) Int. Cl.
*H05K 9/00*   (2006.01)
*F25B 21/02*   (2006.01)
*H05K 7/20*   (2006.01)

(52) U.S. Cl.
CPC .......... *H05K 9/0045* (2013.01); *F25B 21/02* (2013.01); *H05K 7/20145* (2013.01);
(Continued)

(58) Field of Classification Search
CPC .... H05K 9/0045; H05K 7/20; H05K 7/20209; H05K 7/20145; H05K 7/20136; H05K 7/20172; F25B 21/02; F25B 21/04
(Continued)

(56) References Cited

U.S. PATENT DOCUMENTS 7,178,354 B2 * 2/2007 Bretschneider .... H05K 7/20609
                                                                 62/262
2005/0067579 A1 * 3/2005 Tsuchiya ............... G01T 1/2928
                                                                 250/370.15
(Continued)

FOREIGN PATENT DOCUMENTS

KR   10-2006-0047669 A   5/2006
KR   10-2006-0050828 A   5/2006
(Continued)

OTHER PUBLICATIONS

Office Action issued on Jun. 17, 2024, for corresponding Korean Patent Application No. 10-2023-0005941, along with an English machine translation (18 pages).
(Continued)

*Primary Examiner* — Tuan T Dinh
(74) *Attorney, Agent, or Firm* — Hauptman Ham, LLP

(57) ABSTRACT

Disclosed herein is an electromagnetic shielding housing including a housing body, and a fan unit coupled to the housing body, wherein an electromagnetic shielding layer is provided on an inner surface of the housing body, and the fan unit includes a fan configured to generate an air flow into an internal space of the housing body, and a Peltier element configured to cool air flowing into the internal space of the housing body.

16 Claims, 6 Drawing Sheets

(52) U.S. Cl.
CPC ..... *H05K 7/20172* (2013.01); *H05K 7/20209* (2013.01); *F25B 2321/0211* (2013.01); *F25B 2321/0251* (2013.01); *F25B 2700/2104* (2013.01)

(58) Field of Classification Search
USPC .................................................. 361/690–710
See application file for complete search history.

(56) References Cited

U.S. PATENT DOCUMENTS

| | | | | |
|---|---|---|---|---|
| 2009/0310300 | A1* | 12/2009 | Chrysler | ............ H05K 7/20681 62/119 |
| 2017/0056289 | A1* | 3/2017 | Tsuno | ..................... F25D 11/00 |
| 2019/0021184 | A1* | 1/2019 | Williams | .............. F04D 29/441 |
| 2019/0323756 | A1* | 10/2019 | Alexander | .............. F25D 31/00 |
| 2021/0106947 | A1* | 4/2021 | Jouni | .................... F24F 5/0042 |
| 2021/0302074 | A1* | 9/2021 | Artman | .................. F25B 21/04 |

FOREIGN PATENT DOCUMENTS

| | | |
|---|---|---|
| KR | 10-1061109 B1 | 8/2011 |
| KR | 10-2013-0099688 A | 9/2013 |
| KR | 10-2014-0006392 A | 1/2014 |
| KR | 10-2021-0006233 A | 1/2021 |

OTHER PUBLICATIONS

Office Action issued on Feb. 18, 2025 for corresponding Korean Patent Application No. 10-2023-0005941, along with English machine translation (18 pages).

\* cited by examiner

Prior Art

ELECTROMAGNETIC SHIELDING HOUSING AND ELECTROMAGNETIC SHIELDING CIRCUIT UNIT

CROSS-REFERENCE TO RELATED APPLICATION

This application claims the benefit of Korean Patent Application Nos. 10-2022-0039975, filed on Mar. 30, 2022, and 10-2023-0005941, filed on Jan. 16, 2023, in the Korean Intellectual Property Office, the disclosures of which are incorporated herein by reference in their entities.

BACKGROUND

1. Field

Embodiments of the present disclosure relate to an electromagnetic shielding housing and an electromagnetic shielding circuit unit, and more particularly, to an electromagnetic shielding housing and an electromagnetic shielding circuit unit, which are capable of shielding electromagnetic waves and cooling elements using an injected plastic housing instead of a metal.

2. Description of the Related Art

Recently, a number of products supporting the rapid development of the electronic communication industry have been appearing. Functions are becoming more and more diversified as the sizes stay the same or are reduced. In addition, as additional functions are added in addition to the functions typically used in one product, the problem of applying circuit elements for performing the additional functions without increasing a volume or the problem of applying the circuit elements inside a slimmer product has emerged.

Thus, since circuit elements for performing the typical function also perform more diverse functions while sizes thereof are limited or reduced, high-temperature heat is generated according to performing the function, and much research and development are being conducted to solve a heat dissipation problem of these circuit elements.

Conventionally, a separate heat dissipation device, such as a separate heat sink, is additionally installed on the top of the circuit element to solve the heat dissipation problem. This has a problem in that a total volume of a product increases due to the installation of the heat sink, and as a result, the overall volume of the product increases, which is a problem because it is counter to user demand for a miniaturized product.

Meanwhile, circuit elements generate electromagnetic waves during driving, and shield cases are used to shield the electromagnetic waves generated from the circuit elements.

An example of a conventional housing developed to perform a heat dissipation function and a function of a shield case is shown in FIG. 1.

As shown in FIG. 1, a housing provided for heat dissipation and electromagnetic wave shielding of an element 35 provided on a substrate 30 may be provided as a housing body 20 made of a metal, particularly, aluminum. The housing body 20 is coupled to a base housing 40 on which the substrate 30 is installed and accommodates the substrate 30 and the element 35 mounted on the substrate 30 in an internal space 25. The cooling target element 35 mounted on the substrate may be in contact with the housing body 20 through a gap filler 50 with high thermal conductivity and may radiate heat Q to the outside. A heat radiation fin 22 and/or a fan 10 for heat dissipation may be provided in the housing body 20.

As described above, in order to shield electromagnetic waves using the metal housing body 20, a thickness of the shield case is inevitably increased. In this way, when the thickness of the shield case is increased, there is a problem in that an overall weight of the product increases and a manufacturing unit cost increases. In addition, in order to attach the fan 11 to the metal housing body 20, a plastic fan housing 13 needs to be coupled.

Therefore, it is necessary to develop a housing capable of securing electromagnetic wave shielding and heat dissipation performance and achieving slimness.

SUMMARY

Therefore, it is an aspect of the present disclosure to provide an electromagnetic shielding housing and an electromagnetic shielding circuit unit, which are capable of shielding electromagnetic waves and performing cooling on an element using an injected plastic housing instead of a metal.

Additional aspects of the present disclosure will be set forth in part in the description which follows and, in part, will be obvious from the description, or may be learned by practice of the disclosure.

In accordance with one aspect of the present disclosure, an electromagnetic shielding housing includes a housing body, and a fan unit coupled to the housing body, wherein an electromagnetic shielding layer is provided on an inner surface of the housing body, and the fan unit includes a fan configured to generate an air flow into an internal space of the housing body, and a Peltier element configured to cool air flowing into the internal space of the housing body.

The electromagnetic shielding housing may further include a controller configured to control driving of the fan unit.

The electromagnetic shielding housing may further include a temperature sensor provided in the internal space of the housing body.

The controller may control driving of the fan and the Peltier element on the basis of a detection result of the temperature sensor.

The controller may increase a rotating speed of the fan when a temperature is high according to a detection result of the temperature sensor, and the controller may decrease the rotating speed of the fan when the temperature is low according to the detection result of the temperature sensor.

The fan unit may further include a fan housing provided with an air inlet configured to suction outside air and an air outlet configured to discharge the suctioned air to the internal space of the housing body, and the Peltier element may be disposed such that a cooling surface faces an inside of the fan housing and a heat radiating surface faces an outside of the fan housing.

The fan housing may be integrally formed with the housing body.

The fan housing may further include a guide member configured to form a flow path through which the air suctioned into the air inlet and discharged through the air outlet flows, and the guide member may be provided to allow the flow path to come into contact with the cooling surface of the Peltier element.

The Peltier element may be positioned on an upper surface of the fan housing, the air inlet may be positioned in an upper portion of a side surface of the fan housing, and the air outlet may be positioned on a lower surface of the fan housing.

The Peltier element may be disposed such that the cooling surface faces downward and the heat radiating surface faces upward.

In accordance with another aspect of the present disclosure, an electromagnetic shielding circuit unit includes a substrate, a housing body configured to accommodate the substrate therein, and a fan unit coupled to the housing body, wherein an electromagnetic shielding layer is provided on an inner surface of the housing body, and the fan unit includes a fan configured to generate an air flow into an internal space of the housing body, and a Peltier element configured to cool air flowing into the internal space of the housing body.

The electromagnetic shielding circuit unit may further include a controller configured to control driving of the fan unit.

The electromagnetic shielding circuit unit may further include a temperature sensor provided in the internal space of the housing body.

The controller may control driving of the fan and the Peltier element on the basis of a detection result of the temperature sensor.

The controller may increase a rotating speed of the fan when a temperature is high according to a detection result of the temperature sensor, and the controller may decrease the rotating speed of the fan when the temperature is low according to the detection result of the temperature sensor.

The fan unit may further include a fan housing provided with an air inlet configured to suction outside air and an air outlet configured to discharge the suctioned air to the internal space of the housing body, and the Peltier element may be disposed such that a cooling surface faces an inside of the fan housing and a heat radiating surface faces an outside of the fan housing.

The fan housing may be integrally formed with the housing body.

The fan housing may further include a guide member configured to form a flow path through which the air suctioned into the air inlet and discharged through the air outlet flows, and the guide member may be provided to allow the flow path to come into contact with the cooling surface of the Peltier element.

The Peltier element may be positioned on an upper surface of the fan housing, the air inlet may be positioned in an upper portion of a side surface of the fan housing, and the air outlet may be positioned on a lower surface of the fan housing.

The fan unit may be disposed to direct air cooled by the Peltier element and flowing toward a cooling target element mounted on the substrate.

BRIEF DESCRIPTION OF THE DRAWINGS

These and/or other aspects of the present disclosure will become apparent and more readily appreciated from the following description of the embodiments, taken in conjunction with the accompanying drawings of which.

DETAILED DESCRIPTION

Figure 1:
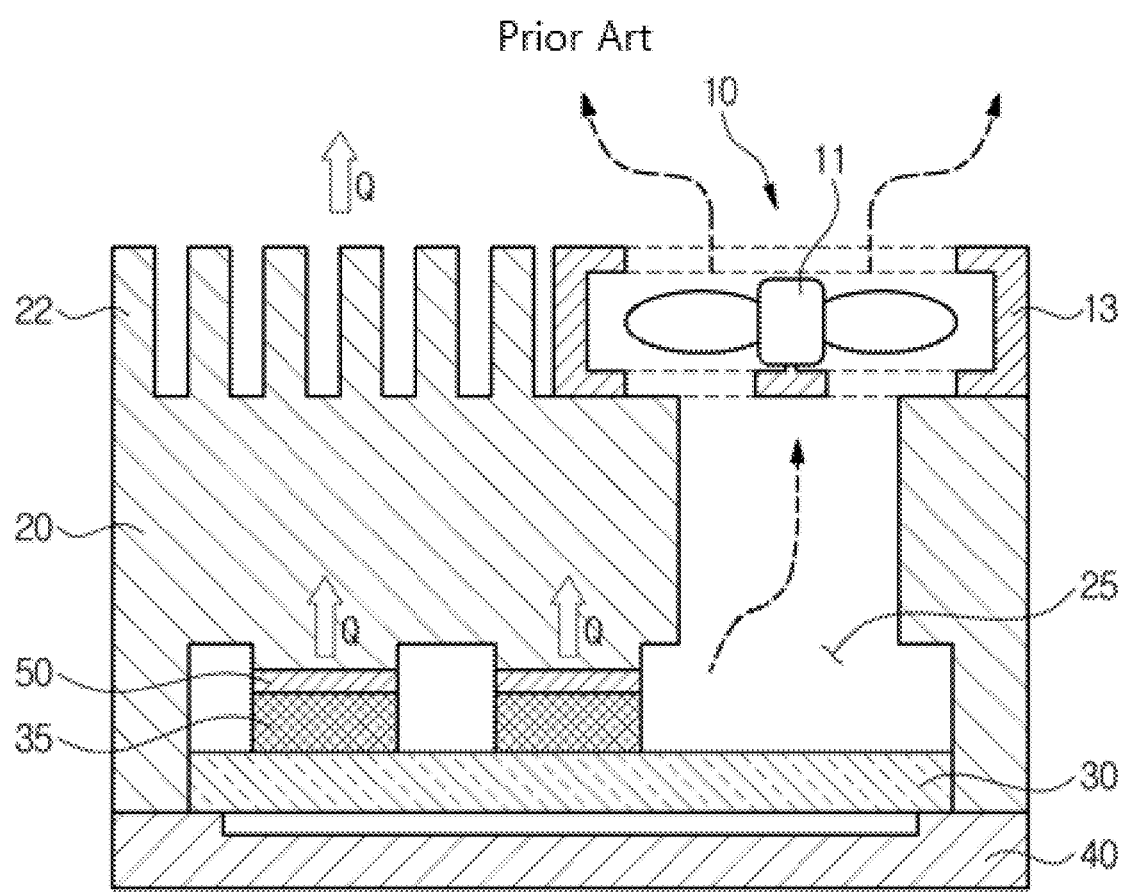
FIG. 1 is a cross-sectional view illustrating a circuit unit including a conventional electromagnetic shielding housing.

The same reference numeral refers to the same component throughout the present specification. The present specification does not describe all components of embodiments, with common descriptions in the technical field to which the present disclosure pertains and overlapping descriptions between the embodiments being omitted. The terms "part," "module," "member," and "block" used herein may be implemented in software or hardware, and according to embodiments, a plurality of "parts," "modules," "members," or "blocks" can be implemented in a single component or a single "part," "module," "member," or "block" can include a plurality of components.

Throughout this specification, when a part is referred to as being "connected" to another part, this includes not only direct connection but also indirect connection, and the indirect connection includes connection through a wireless communication network.

Further, when a part is referred to as "including" a component, this does not mean that other elements are excluded, and other elements can be included unless specifically stated otherwise.

The terms "first," "second," and the like are used to distinguish one component from another component, and components are not limited by these terms.

The singular forms include plural forms unless the context clearly notes otherwise.

In each operation, a reference numeral is used for convenience of description, but this reference numeral does not describe the order of the operations, and the operations may be performed differently from the described order unless clearly specified in the context.

Hereinafter, an operation principle and embodiments of the present disclosure will be described with reference to the accompanying drawings.

Figure 2:
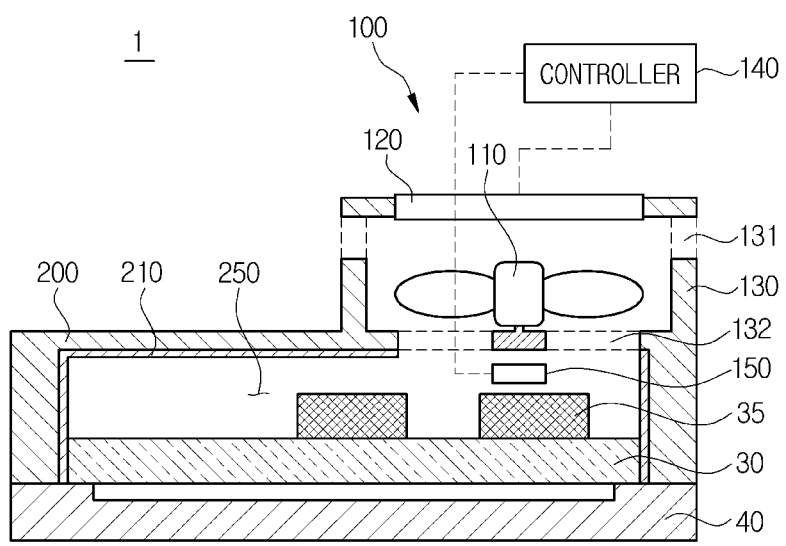
FIG. 2 is a cross-sectional view illustrating an electromagnetic shielding circuit unit according to one embodiment of the present disclosure.
Figure 3:
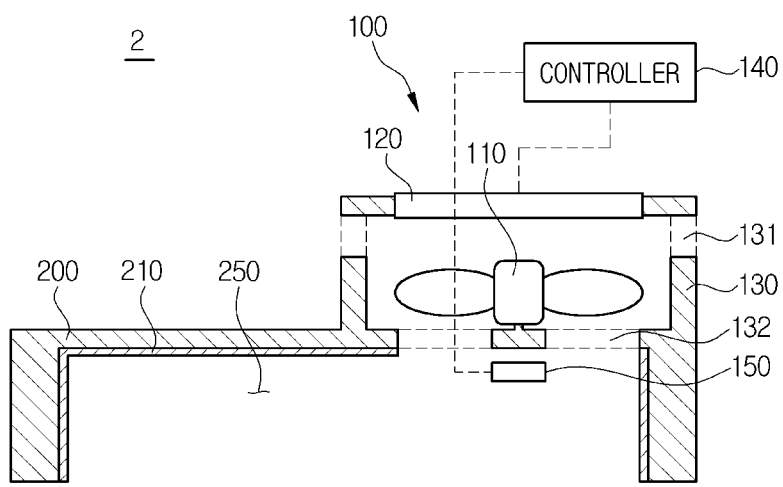
FIG. 3 is a cross-sectional view illustrating an electromagnetic shielding housing according to one embodiment of the present disclosure.
Figure 4:
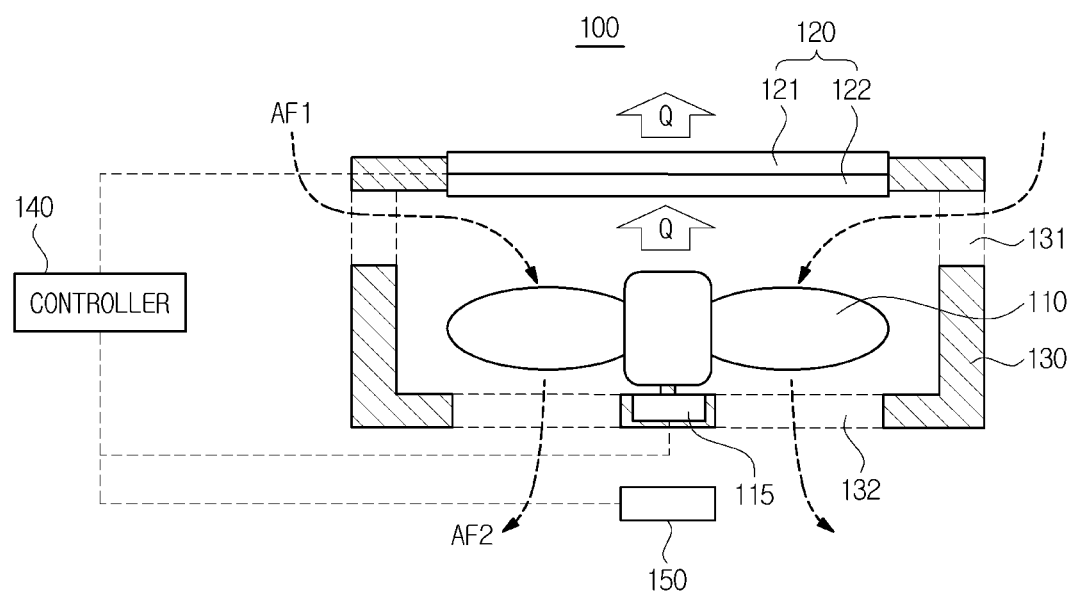
FIG. 4 is a cross-sectional view illustrating an air flow in a fan unit according to one embodiment of the present disclosure.

FIG. 2 is a cross-sectional view illustrating an electromagnetic shielding circuit unit according to one embodiment of the present disclosure, FIG. 3 is a cross-sectional view illustrating an electromagnetic shielding housing according to one embodiment of the present disclosure, and FIG. 4 is a cross-sectional view illustrating an air flow in a fan unit according to one embodiment of the present disclosure.

Referring to FIG. 2, an electromagnetic shielding circuit unit according to one embodiment of the present disclosure includes a substrate 30, a base housing 40 in which the substrate 30 is installed, and an electromagnetic shielding housing 2 accommodating the substrate 30 therein.

A circuit may be provided on the substrate 30, and various types of elements may be mounted thereon. The substrate 30 may be fixed to the base housing 40, and the base housing 40 may accommodate the substrate 30 in an internal space 250 formed by coupling to an electromagnetic shielding housing 2 which will be described below.

Referring to FIGS. 2 and 3, the electromagnetic shielding housing 2 according to one embodiment of the present disclosure may include a housing body 200 configured to accommodate the substrate 30 therein, a fan unit 100 coupled to the housing body 200, a controller 140 configured to control driving of the fan unit 100, and a temperature sensor 150 provided in the internal space 250 of the housing body 200.

The housing body 200 accommodates the substrate 30 therein. The housing body 200 is coupled to the base housing 40 and provided to surround the substrate so that electromagnetic shielding may be achieved.

In one embodiment of the present disclosure, the housing body 200 may be made of a plastic material. The housing body 200 may be made of injection molded plastic. Since the housing body 200 is made of a plastic material, a manufacturing process can be simplified and a manufacturing unit cost can be reduced.

An electromagnetic shielding layer may be provided on an inner surface of the housing body 200. The electromagnetic shielding layer may be provided on the inner surface of the housing body 200 to shield the internal space 250 of the housing body 200.

The electromagnetic shielding layer 210 may be formed by applying an electromagnetic shielding paste on the inner surface of the housing body 200. The electromagnetic shielding paste may be prepared to include a conductive material such as a metal. For example, the electromagnetic shielding paste may include a metal powder, a conductive polymer, and carbon nanotubes.

The electromagnetic shielding layer 210 may have a thickness of 1 mm or less. The electromagnetic shielding layer 210 may exhibit sufficient electromagnetic shielding performance even with a thickness of several micrometers according to a material forming the electromagnetic shielding layer 210.

Referring to FIGS. 2 and 3, in one embodiment of the present disclosure, the fan unit 100 may include a fan 110 provided to generate an air flow into the internal space 250 of the housing body 200, a Peltier element 120 provided to cool air flowing into the internal space 250 of the housing body 200, and a fan housing 130 including an air inlet 131 for suctioning outside air and an air outlet 132 for discharging the suctioned outside air into the internal space 250 of the housing body 200.

The components of the fan unit 100 are provided to be coupled to the fan housing 130. As shown in FIGS. 2 and 3, the fan 110 may be accommodated inside the fan housing 130, and the Peltier element 120 may be coupled to pass through the fan housing 130 and may be provided such that one side of the Peltier element 120 faces an outside of the fan housing 130 and the other side thereof faces an inside of the fan housing 130.

The fan 110 is provided to generate an air flow into the internal space 250 of the housing body 200. As shown in FIGS. 2 and 3, the fan 110 is provided inside the fan housing 130 to generate an air flow through the fan housing 130. Preferably, the fan 110 generates an air flow such that air is suctioned through the air inlet 131 provided in the fan housing 130 and discharged through the air outlet 132.

The air inlet 131 is provided to suction outside air, and the air outlet 132 is provided to discharge the suctioned outside air into the internal space 250 of the housing body 200. To form an air flow from the air inlet 131 toward the air outlet 132 by the driving of the fan 110, the air inlet 131 and the air outlet 132 may be positioned on sides opposite to each other with the fan 110 interposed therebetween. In the embodiment shown in FIGS. 2 and 3, the air inlet 131 is positioned above the fan 110, and the air outlet 132 is positioned below the fan 110. The fan 110 forms an air flow from an upper side toward a lower side so that outside air is suctioned through the air inlet 131, and the suctioned air is discharged into the internal space 250 of the housing body 200 through the air outlet 132.

The Peltier element 120 is an element using the Peltier effect that heat is absorbed on one side and heat is generated on the other side according to a direction of a current when a DC voltage is applied to both ends of two different elements. The basic principle of the Peltier effect is that electrons require energy to move between two metals with a potential difference, and energy required for the movement is taken away from energy possessed by the metals. When the direction of a current flow is changed, the flow of electrons and holes also changes, and thus heat emitting/absorbing surfaces are also reversed.

The fan unit 100 of the present disclosure may absorb heat from the air flowing in the fan housing 130, perform cooling using the Peltier element 120, and radiate the absorbed heat to the outside of the fan housing 130, thereby cooling the cooling target element 35 mounted on the substrate 30.

In one embodiment of the present disclosure, the fan housing 130 may be integrally formed with the housing body 200. In one embodiment of the present disclosure, the housing body 200 may be made of a plastic material and integrally formed with the fan housing 130. Therefore, during manufacturing, the manufacturing process may be simplified by directly assembling the fan unit 100 with the fan housing 130 integrally formed with the housing body 200 without coupling the fan housing 130 to the housing body 200 after the fan unit 100 is assembled.

Meanwhile, in one embodiment of the present disclosure, the fan unit 100 may be disposed in the housing body 200 to direct the air cooled by the Peltier element 120 to flow toward the cooling target element 35 mounted on the substrate 30.

Meanwhile, referring to FIG. 2, the air flowing from the fan unit 100 flows to a lower side of the fan unit 100 due to the fan 110. In this case, the fan unit 100 is positioned above the cooling target element 35 mounted on the substrate 30, and thus the air flows toward the cooling target element 35. In this case, since the air has been cooled by the Peltier element 120, the cooling target element 35 may be efficiently cooled.

Meanwhile, in one embodiment of the present disclosure, the controller 140 controls the driving of the fan unit 100. More specifically, the controller 140 controls driving of the fan 110 and the Peltier element 120. To this end, the controller 140 may be electrically connected to the fan 110 and the Peltier element 120. The controller 140 may be provided in the fan unit 100 or the housing body 200 or may be provided in a separate space to be electrically connected thereto through an electric wire or the like.

As one example, the controller 140 may be provided on the substrate 30 accommodated inside the housing 2. The controller 140 may be provided on the substrate 30 and electrically connected to the fan 110 and the Peltier element 120 through a connector (not shown) provided in the substrate 30.

The controller 140 may control the driving of the fan 110 and the Peltier element 120 by controlling a voltage or a current provided to the fan 110 and the Peltier element 120.

For example, the controller 140 may increase a voltage provided to the motor 115 of the fan 110 to provide a fast rotating speed of the fan 110, control a voltage supplied to the Peltier element 120, or perform on/off control of power provided to the Peltier element 120 to control an output of the Peltier element 120.

The temperature sensor 150 may be provided in the internal space 250 of the housing body 200 to detect a temperature of the internal space 250. In one embodiment of the present disclosure, the controller 140 may control the driving of the fan 110 and the Peltier element 120 on the basis of the detection result of the temperature sensor 150. To this end, the controller 140 may be electrically connected to the temperature sensor 150.

As one example, the controller 140 and the temperature sensor 150 may be provided on the substrate 30 accommodated inside the housing 2. Both the controller 140 and the temperature sensor 150 are provided on the substrate 30, and the controller 140 and the temperature sensor 150 may be electrically connected through a connection circuit provided in the substrate 30.

The controller 140 controls the driving of the fan 110 and the Peltier element 120 according to the temperature of the internal space 250 detected by the temperature sensor 150 to efficiently cool the element 35 of the substrate 30.

For example, the controller 140 may increase a rotating speed of the fan 110 when the temperature detected by the temperature sensor 150 is high, and the controller 140 may decrease the rotating speed of the fan 110 when the temperature detected by the temperature sensor 150 is low.

Alternatively, the controller 140 may increase an output of the Peltier element 120 when the temperature detected by the temperature sensor 150 is high, and the controller 140 may decrease the output of the Peltier element 120 when the temperature detected by the temperature sensor 150 is low.

In one embodiment of the present disclosure, the controller 140 may simultaneously perform control of the fan 110 and the Peltier element 120 on the basis of the detection result of the temperature sensor 150. For example, the controller 140 may increase the rotating speed of the fan 110 and the output of the Peltier element 120 when the temperature detected by the temperature sensor 150 is high, and the controller 140 may decrease the rotating speed of the fan 110 and the output of the Peltier element 120 when the temperature detected by the temperature sensor 150 is low.

Referring to FIG. 4, it can be seen that an air flow is formed by the fan unit 100.

Referring to FIG. 4, the Peltier element 120 may be disposed such that a cooling surface 122 faces the inside of the fan housing 130 and a heat radiating surface 121 faces the outside of the fan housing 130. The cooling surface 122 may be disposed to face the inside of the fan housing 130 to cool air introduced into the fan housing 130.

As shown in FIG. 4, in one embodiment of the present disclosure, the Peltier element 120 may be positioned on an upper surface of the fan housing 130, the air inlet 131 may be positioned in an upper portion of a side surface of the fan housing 130, and the air outlet 132 may be positioned on a lower surface of the fan housing 130. In this case, the Peltier element 120 is disposed such that the cooling surface 122 faces downward and the heat radiating surface 121 faces upward.

The fan 110 is positioned below the air inlet 131 and above the air outlet 132 to form a downward air flow.

Through the above structure, a first air flow AF1 through the air inlet 131 positioned in the upper portion of the side surface of the fan housing 130 is cooled by the cooling surface 122 of the Peltier element 120 positioned on the upper surface of the fan housing 130.

Meanwhile, a second air flow AF2 formed downward by the fan 110 may allow the air cooled by the Peltier element 120 to be discharged through the air outlet 132.

When the air cooled by the Peltier element 120 is discharged to the internal space 250 of the housing body 200 through the air outlet 132, the substrate 30 and the element 35 accommodated in the internal space 250 may be cooled. The electromagnetic shielding housing 2 of the present disclosure includes the housing body 200 not made of a metal material and performs cooling through the Peltier element 120, thereby exhibiting high cooling performance.

Figure 5:
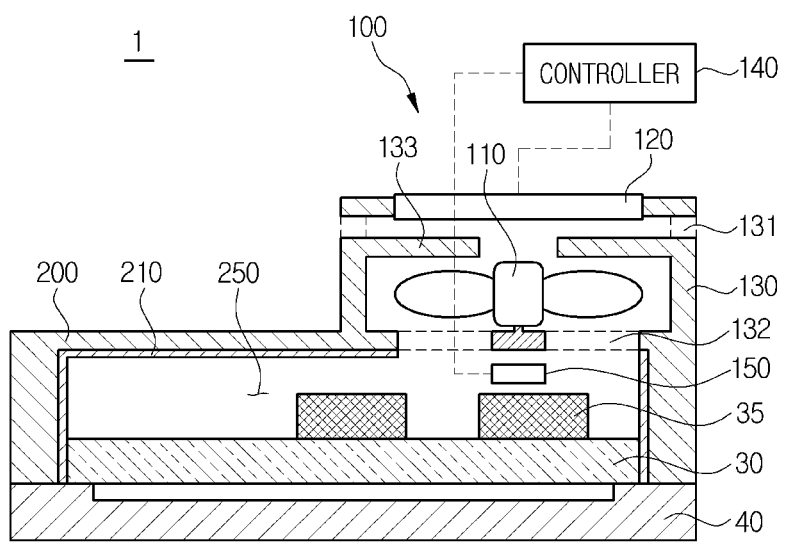
FIG. 5 is a cross-sectional view illustrating an electromagnetic shielding housing according to another embodiment of the present disclosure.
Figure 6:
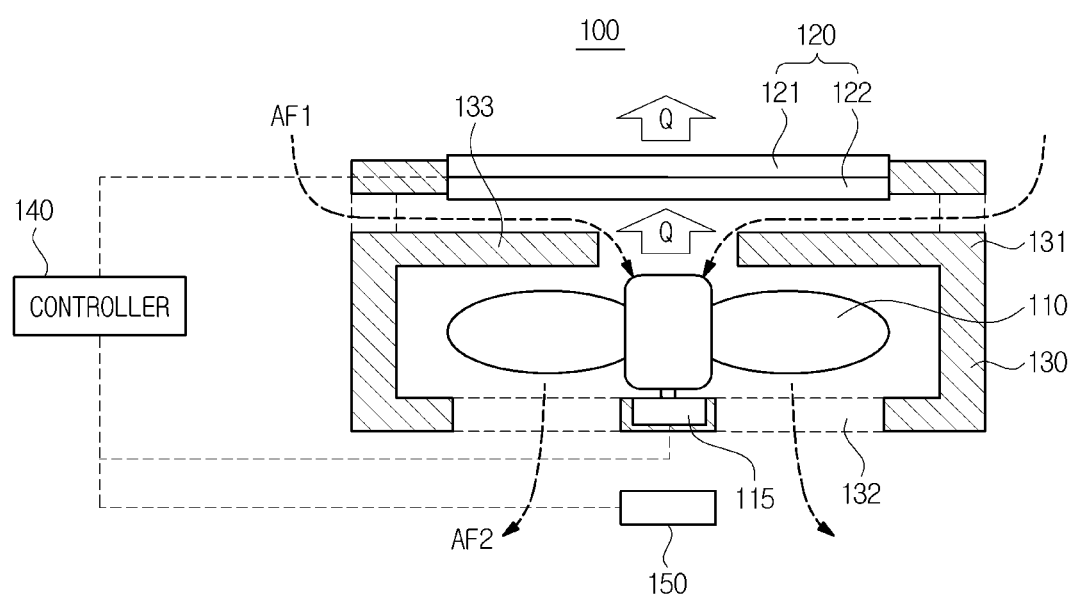
FIG. 6 is a cross-sectional view illustrating an air flow in a fan unit according to another embodiment of the present disclosure.

FIG. 5 is a cross-sectional view illustrating an electromagnetic shielding housing according to another embodiment of the present disclosure, and FIG. 6 is a cross-sectional view illustrating an air flow in a fan unit according to another embodiment of the present disclosure.

The electromagnetic shielding housing 2 according to the present embodiment shown in FIGS. 5 and 6, as in the embodiment shown in FIGS. 2 to 4, may include a housing body 200 configured to accommodate a substrate 30 therein, a fan unit 100 coupled to the housing body 200, a controller 140 configured to control driving of the fan unit 100, and a temperature sensor 150 provided in an internal space 250 of the housing body 200. The fan unit 100 may include a fan 110 provided to generate an air flow into the internal space 250 of the housing body 200, a Peltier element 120 provided to cool air flowing into the internal space 250 of the housing body 200, and a fan housing 130 including an air inlet 131 for suctioning outside air and an air outlet 132 for discharging the suctioned outside air into the internal space 250 of the housing body 200.

In this case, in the present embodiment shown in FIGS. 5 and 6, the fan housing 130 may further include a guide member 133 forming a flow path through which air suctioned into the air inlet 131 and discharged through the air outlet 132 flows.

As in the embodiment shown in FIGS. 2 to 4, in the present embodiment shown in FIGS. 5 and 6, a Peltier element 120 may be positioned on an upper surface of the fan housing 130, the air inlet 131 may be positioned in an upper portion of a side surface of the fan housing 130, and the air outlet 132 may be positioned on a lower surface of the fan housing 130. In this case, the Peltier element 120 may be disposed such that a cooling surface 122 faces downward and a heat radiating surface 121 faces upward.

In this case, in the present embodiment shown in FIGS. 5 and 6, the guide member 133 may be provided to allow the flow path, through which air suctioned into the air inlet 131 and discharged through the air outlet 132 flows, to come into contact with the cooling surface 122 of the Peltier element 120.

In the present embodiment shown in FIGS. 5 and 6, the guide member 133 may be positioned below the air inlet 131 to form a flow path through which air suctioned into the air inlet 131 does not directly flow in a direction of the fan 110 and flows in a horizontal direction along a lower side of the cooling surface 122 of the Peltier element 120, thereby flowing downward in a central portion of the fan 110.

In this way, the guide member 133 forms the flow path to allow the air suctioned into the air inlet 131 to be in contact with the cooling surface 122 of the Peltier element 120 for a longer period of time so that cooling efficiency of the fan unit 100 can be increased.

As is apparent from the above description, in accordance with an electromagnetic shielding housing and an electromagnetic shielding circuit unit according to the embodiments of the present disclosure, by forming an electromagnetic shielding layer using an electromagnetic shielding paste on an inexpensive plastic housing, a manufacturing unit cost can be reduced.

In accordance with the electromagnetic shielding housing and the electromagnetic shielding circuit unit according to the embodiments of the present disclosure, by integrally forming a housing body accommodating a substrate and a fan housing accommodating a fan, a manufacturing process can be simplified and the manufacturing unit cost can be reduced.

In accordance with the electromagnetic shielding housing and the electromagnetic shielding circuit unit according to the embodiments of the present disclosure, cooling is performed using a Peltier element so that cooling performance can be improved.

In accordance with the electromagnetic shielding housing and the electromagnetic shielding circuit unit according to the embodiments of the present disclosure, by adjusting the cooling performance according to an internal temperature of the housing, power can be used efficiently.

The disclosed embodiments have been described above with reference to the accompanying drawings. It would be appreciated by those skilled in the art to which the present disclosure pertains that other forms different from the disclosed embodiments can be implemented without departing from the technical spirit and essential features of the present disclosure. The disclosed embodiments are illustrative and should not be construed as limitative.

What is claimed is:

1. An electromagnetic shielding housing, comprising:
a housing body; and
a fan unit coupled to the housing body,
wherein
an electromagnetic shielding layer is provided on an inner surface of the housing body,
the fan unit includes:
a fan configured to generate an air flow into an internal space of the housing body;
a Peltier element configured to cool air flowing into the internal space of the housing body; and
a fan housing provided with an air inlet configured to suction outside air and an air outlet configured to discharge the suctioned air to the internal space of the housing body,
the Peltier element is disposed such that a cooling surface faces an inside of the fan housing and a heat radiating surface faces an outside of the fan housing,
the Peltier element is positioned on an upper surface of the fan housing,
the air inlet is positioned in an upper portion of a side surface of the fan housing, and
the air outlet is positioned on a lower surface of the fan housing.

2. The electromagnetic shielding housing of claim 1, further comprising a controller configured to control driving of the fan unit.

3. The electromagnetic shielding housing of claim 1, wherein the fan housing is integrally formed with the housing body.

4. The electromagnetic shielding housing of claim 1, wherein:
the fan housing further includes a guide member configured to form a flow path through which the air suctioned into the air inlet and discharged through the air outlet flows; and
the guide member is provided to allow the flow path to come into contact with the cooling surface of the Peltier element.

5. The electromagnetic shielding housing of claim 1, wherein the Peltier element is disposed such that the cooling surface faces downward and the heat radiating surface faces upward.

6. The electromagnetic shielding housing of claim 2, further comprising a temperature sensor provided in the internal space of the housing body.

7. The electromagnetic shielding housing of claim 6, wherein the controller controls driving of the fan and the Peltier element on the basis of a detection result of the temperature sensor.

8. The electromagnetic shielding housing of claim 7, wherein the controller increases a rotating speed of the fan when a temperature is high according to a detection result of the temperature sensor, and the controller decreases the rotating speed of the fan when the temperature is low according to the detection result of the temperature sensor.

9. An electromagnetic shielding circuit unit, comprising:
a substrate;
a housing body configured to accommodate the substrate therein; and
a fan unit coupled to the housing body,
wherein
an electromagnetic shielding layer is provided on an inner surface of the housing body,
the fan unit includes:
a fan configured to generate an air flow into an internal space of the housing body;
a Peltier element configured to cool air flowing into the internal space of the housing body; and
a fan housing provided with an air inlet configured to suction outside air and an air outlet configured to discharge the suctioned air to the internal space of the housing body,
the Peltier element is disposed such that a cooling surface faces an inside of the fan housing and a heat radiating surface faces an outside of the fan housing,
the Peltier element is positioned on an upper surface of the fan housing,
the air inlet is positioned in an upper portion of a side surface of the fan housing, and
the air outlet is positioned on a lower surface of the fan housing.

10. The electromagnetic shielding circuit unit of claim 9, further comprising a controller configured to control driving of the fan unit.

11. The electromagnetic shielding circuit unit of claim 9, wherein the fan housing is integrally formed with the housing body.

12. The electromagnetic shielding circuit unit of claim 9, wherein:
the fan housing further includes a guide member configured to form a flow path through which the air suctioned into the air inlet and discharged through the air outlet flows; and
the guide member is provided to allow the flow path to come into contact with the cooling surface of the Peltier element.

13. The electromagnetic shielding circuit unit of claim 9, wherein the fan unit is disposed to direct air cooled by the Peltier element and flowing toward a cooling target element mounted on the substrate.

14. The electromagnetic shielding circuit unit of claim 10, further comprising a temperature sensor provided in the internal space of the housing body.

15. The electromagnetic shielding circuit unit of claim 14, wherein the controller controls driving of the fan and the Peltier element on the basis of a detection result of the temperature sensor.

16. The electromagnetic shielding circuit unit of claim 15, wherein the controller increases a rotating speed of the fan when a temperature is high according to a detection result of the temperature sensor, and the controller decreases the rotating speed of the fan when the temperature is low according to the detection result of the temperature sensor.

* * * * *